US010527948B2

(12) United States Patent
Nagahara et al.

(10) Patent No.: US 10,527,948 B2
(45) Date of Patent: Jan. 7, 2020

(54) OPTICAL PROCESSING APPARATUS, COATING/DEVELOPMENT APPARATUS, OPTICAL PROCESSING METHOD, AND NON-TRANSITORY COMPUTER-READABLE STORAGE MEDIUM

(71) Applicant: Tokyo Electron Limited, Tokyo (JP)

(72) Inventors: Seiji Nagahara, Tokyo (JP); Masaru Tomono, Koshi (JP); Nobutaka Fukunaga, Koshi (JP); Gousuke Shiraishi, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 15/828,870

(22) Filed: Dec. 1, 2017

(65) Prior Publication Data

US 2018/0173103 A1    Jun. 21, 2018

(30) Foreign Application Priority Data

Dec. 20, 2016    (JP) .................................. 2016-246677

(51) Int. Cl.
  *G03F 7/20*    (2006.01)
  *H01L 21/027*    (2006.01)

(52) U.S. Cl.
  CPC .......... *G03F 7/7055* (2013.01); *G03F 7/2022* (2013.01); *H01L 21/027* (2013.01)

(58) Field of Classification Search
  CPC .. G03F 7/2022; G03F 7/7055; G03F 7/70558; G03F 7/201; G03F 7/7005; G03F 7/70133
  See application file for complete search history.

(56) References Cited

U.S. PATENT DOCUMENTS

| 6,115,107 | A | * | 9/2000 | Nishi | ................... G03F 7/70058 |
| | | | | | 355/53 |
| 2006/0114440 | A1 | * | 6/2006 | Sekigawa | ........... G03F 7/70141 |
| | | | | | 355/69 |
| 2008/0023639 | A1 | * | 1/2008 | Kawasaki | ......... H01L 21/67115 |
| | | | | | 250/372 |
| 2010/0236089 | A1 | * | 9/2010 | Kawasaki | ............. G03F 7/2022 |
| | | | | | 34/275 |

(Continued)

FOREIGN PATENT DOCUMENTS

JP    2015-156472 A1    8/2015

*Primary Examiner* — Steven Whitesell Gordon
(74) *Attorney, Agent, or Firm* — Burr & Brown, PLLC

(57) ABSTRACT

An illuminance distribution response amount as the change amount of the illuminance distribution pattern, associating the position in the irradiation region in the lengthwise direction with the change amount of the illuminance with respect to the change in the drive current, has previously been acquired and stored in a storage unit for each light-emitting block. There is provided an arithmetic processing unit that determines (estimates) a current command value of each of the light-emitting blocks based on a present current command value of each of the light-emitting blocks and the change amount of the illuminance distribution pattern of each light-emitting block in order to bring a present illuminance distribution pattern in the irradiation region in a lengthwise direction close to a target illuminance distribution pattern.

18 Claims, 10 Drawing Sheets

(56) References Cited

U.S. PATENT DOCUMENTS

| | | | |
|---|---|---|---|
| 2011/0043784 A1* | 2/2011 | Aoki | B65G 49/065 355/72 |
| 2012/0002183 A1* | 1/2012 | Ota | G03F 7/70291 355/67 |
| 2016/0291480 A1* | 10/2016 | Kaiser | G03F 7/70191 |
| 2016/0327869 A1 | 11/2016 | Nagahara et al. | |

* cited by examiner

OPTICAL PROCESSING APPARATUS, COATING/DEVELOPMENT APPARATUS, OPTICAL PROCESSING METHOD, AND NON-TRANSITORY COMPUTER-READABLE STORAGE MEDIUM

CROSS-REFERENCE TO RELATED APPLICATIONS

This application is based upon and claims the benefit of priority from Japanese Patent Application No. 2016-246677, filed on Dec. 20, 2016; the entire contents of which are incorporated herein by reference.

BACKGROUND OF THE INVENTION

Field of the Invention

The present invention relates to a technology for processing a surface of a workpiece by irradiating the surface with light.

Description of the Related Art

With the miniaturization of circuit patterns of semiconductor devices, higher resolution of the circuit patterns is being desired. As a method for meeting this desire, extreme-ultraviolet (EUV) exposure is known, for example. However, when the light intensity of the exposure light source is increased, the EUV exposure requires a large-scale apparatus and a lot of cost. Thus, downsizing of the apparatus is necessary, but in such a case, the light intensity and throughput are necessitated to be low.

To address this problem, Japanese patent application publication No. 2015-156472 discloses an exposure apparatus that improves in-plane uniformity of line width of a pattern (circuit pattern) on a semiconductor wafer (hereinafter referred to simply as a "wafer") by performing pattern exposure on the wafer, coated with a resist of the photosensitization chemical amplification type, by use of a pattern mask and thereafter further performing batch exposure on pattern-exposed regions. This so-called batch exposure apparatus uses a light-emitting diode (LED) as the light source and performs exposure on the whole surface of the wafer by forming a strip-shaped irradiation region, slightly longer than the wafer's diameter, on the wafer and moving the wafer in a direction orthogonal to the extending direction of the irradiation region.

In cases where such a strip-shaped irradiation region is formed by using an LED, the improvement in the in-plane uniformity of the line width requires uniformity of the illuminance in the lengthwise direction of the irradiation region since the pattern is being more and more miniaturized. Further, in actual semiconductor manufacturing factories, individual differences in the illuminance among a plurality of batch exposure apparatuses (including errors among apparatuses) also have to be reduced as much as possible. However, since the LED characteristics slightly vary among individual LEDs due to manufacturing errors or the like and also vary with time, such requirements cannot be fulfilled just by the simple work of adjusting the drive current of the LED to a set value. Thus, it is necessary to establish a technology capable of meeting the above-described requirements.

SUMMARY OF THE INVENTION

The present invention has been made under the above-described circumstances, and an object of the present invention is to provide a technology capable of easily adjusting an illuminance distribution pattern in the irradiation region in the lengthwise direction to a target illuminance distribution pattern with high accuracy when optical processing is performed on a workpiece by forming a strip-shaped irradiation region with a light source unit in which a plurality of light-emitting blocks, each formed of one or more light-emitting diodes, are linearly arranged.

An optical processing apparatus according to the present invention includes:
a mount part on which a workpiece to be processed with light can be set;
an optical irradiation unit in which a plurality of light-emitting blocks, each formed of one light-emitting diode or a plurality of light-emitting diodes connected in series, are linearly arranged in a transverse direction for forming a strip-shaped irradiation region extending in the transverse direction;
a moving mechanism for moving the mount part and the optical irradiation unit relative to each other in a longitudinal direction;
a storage unit that stores a change amount of an illuminance distribution pattern, associating each position in the irradiation region in the transverse direction with a change amount of illuminance at the position with respect to a change in current, in regard to each of the light-emitting blocks; and
an arithmetic processing unit that determines a current command value of each of the light-emitting blocks based on a present current command value of each of the light-emitting blocks and the change amount of the illuminance distribution pattern of each light-emitting block stored in the storage unit in order to bring a present illuminance distribution pattern in the irradiation region in a lengthwise direction close to a target illuminance distribution pattern.

Another invention is a coating/development apparatus including a module for forming a resist film on a substrate by using a coating liquid, a module for developing the substrate (W) after pattern exposure, a transfer mechanism for transferring the substrate between the modules, and the optical processing apparatus according to the present invention.

Still another invention is an optical processing method for processing a workpiece with light, in which:
the optical processing method uses:
an optical irradiation unit in which a plurality of light-emitting blocks, each formed of one light-emitting diode or a plurality of light-emitting diodes connected in series, are linearly arranged in a transverse direction for forming a strip-shaped irradiation region extending in the transverse direction; and
a storage unit that stores a change amount of an illuminance distribution pattern, associating each position in the irradiation region in the transverse direction with a change amount of illuminance at the position with respect to a change in current, in regard to each of the light-emitting blocks, and
the optical processing method includes:
a step of determining a current command value of each of the light-emitting blocks based on a present current command value of each of the light-emitting blocks and the change amount of the illuminance distribution pattern of each light-emitting block stored in the storage unit in order to bring a present illuminance distribution pattern in the irradiation region in a lengthwise direction close to a target illuminance distribution pattern;

a step of making each light-emitting block emit light at the current command value determined by the former step; and a step of subsequently moving the optical irradiation unit and a mount part with the workpiece set thereon relative to each other in a longitudinal direction.

Yet another invention is a non-transitory computer-readable storage medium storing a computer program to be used for an apparatus that performs processing on a workpiece by irradiating the workpiece with light and includes:

an optical irradiation unit in which a plurality of light-emitting blocks, each formed of one light-emitting diode or a plurality of light-emitting diodes connected in series, are linearly arranged in a transverse direction for forming a strip-shaped irradiation region; and a storage unit that stores a change amount of an illuminance distribution pattern, associating each position in the irradiation region in the transverse direction with a change amount of illuminance at the position per unit current, in regard to each of the light-emitting blocks, in which the computer program describes steps programmed to execute the optical processing method according to the present invention.

According to the present invention, in an optical irradiation unit in which a plurality of light-emitting blocks each employing one or more LEDs are linearly arranged, the change amount (response) of the illuminance distribution pattern (illuminance profile), associating the position in the irradiation region in the lengthwise direction with the change amount of the illuminance with respect to the change in the current (drive current), has previously been acquired for each light-emitting block. When the current of each light-emitting block has been changed, the illuminance distribution pattern of each light-emitting block is obtained by using the change amount of the illuminance distribution pattern (the term "illuminance distribution response amount" is used in the description of the embodiment), and the illuminance distribution pattern of all the light-emitting blocks in the lengthwise direction is estimated by obtaining the sum of the illuminance distribution patterns of the light-emitting blocks. Since it is possible to obtain the present illuminance distribution pattern in the whole range in the lengthwise direction and to bring the illuminance distribution pattern close to the target illuminance distribution pattern by using the illuminance distribution response amounts, the illuminance distribution pattern in the lengthwise direction of the irradiation region can be adjusted to the target illuminance distribution pattern with ease and with high accuracy, and difference in the illuminance distribution pattern among apparatuses (i.e., among a plurality of optical processing apparatuses) can be kept down.

DETAILED DESCRIPTION OF THE INVENTION

Figure 1:
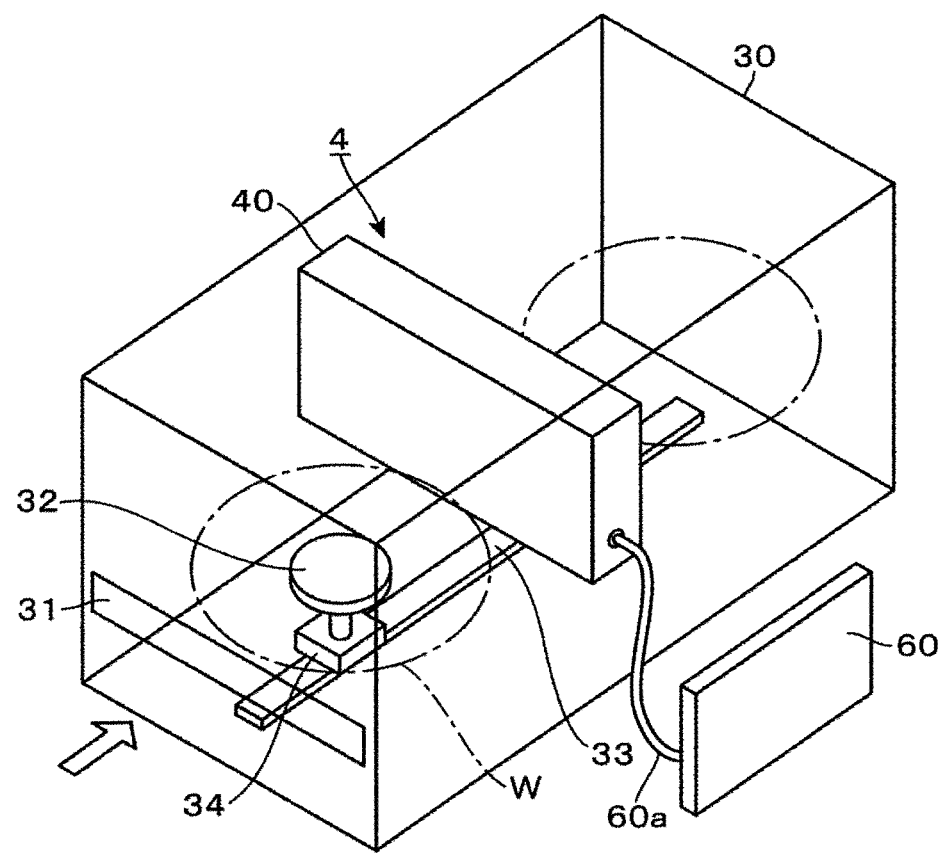
FIG. 1 is a perspective view showing the general configuration of an optical processing apparatus according to an embodiment of the present invention.

FIG. 1 is an external view (perspective view) of an optical processing apparatus according to an embodiment of the present invention. The optical processing apparatus comprises a housing 30 with a carry-in/carry-out port 31 formed on the front side. In FIG. 1, the housing 30 is drawn transparently to make the inside of the housing 30 visible. A mount 32 on which a wafer W, as a workpiece that will undergo optical processing such as exposure, can be set is provided on the base of the housing 30. The mount 32 can be moved freely along a guide rail 33 extending from a handover position (position shown in FIG. 1) for a wafer W on the side of the carry-in/carry-out port 31 to a standby position on the far side of the housing 30. The mount 32 is connected, via a rotary shaft, to a drive unit 34 for rotating a wafer W set on the mount 32 around the vertical axis. Incidentally, the drive unit 34 is described as a combination of a motor which rotates the mount 32 and a moving mechanism which holds the motor and moves along the guide rail 33.

In the standby position on the far side of the housing 30, a well-known positioning mechanism (mechanism including a light-emitting unit and a photoreceptor unit vertically facing each other across the circumferential part of the wafer W), which is not illustrated in the drawings, is provided. The positioning mechanism detects the orientation of a notch serving as a positioning part formed on the circumference of the wafer W and performs control so that the orientation of the wafer W undergoing the exposure process is kept constant by the rotation of the mount 32 by the drive unit 34.

Figure 2:
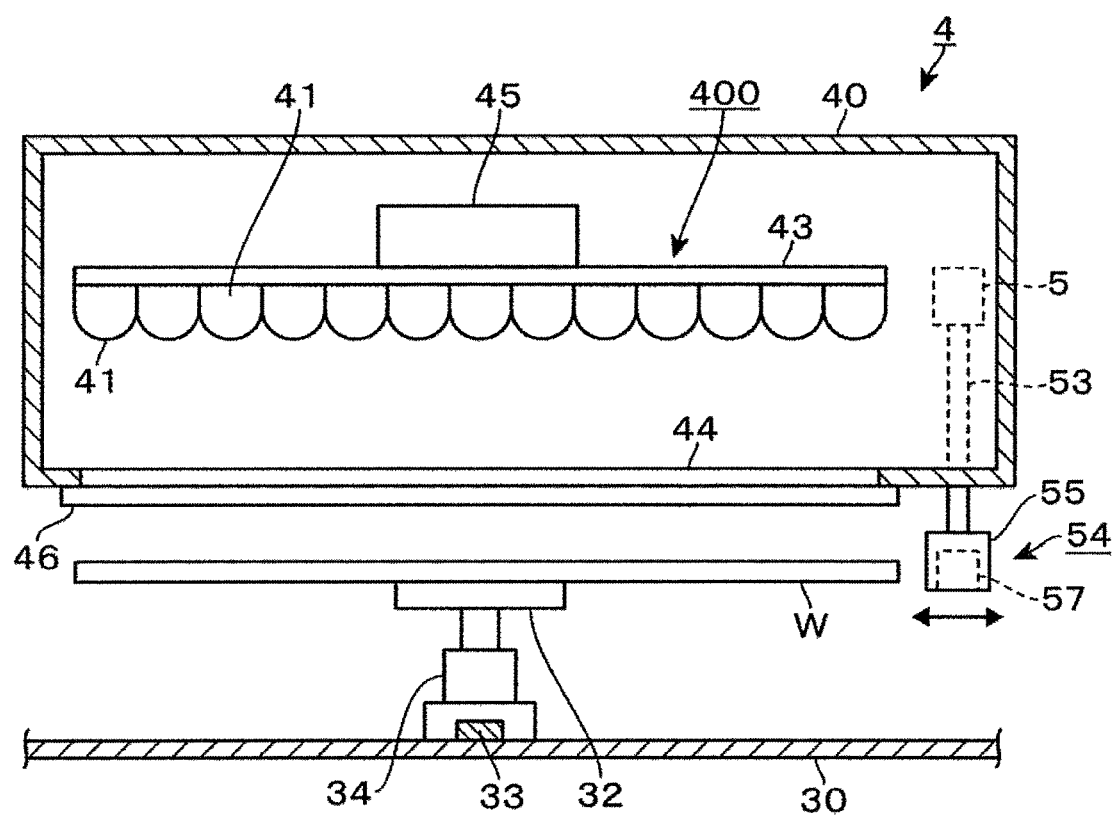
FIG. 2 is a vertical sectional front view showing an optical irradiation unit used for the optical processing apparatus.

An optical irradiation unit 4 for irradiating the wafer W with ultraviolet rays is provided above a position between the handover position for a wafer W and the aforementioned standby position in a wafer W movement region in which the wafer W moves. Assuming that the moving direction of the wafer W is a longitudinal direction, the optical irradiation unit 4 has a rectangular case body 40 wider in a transverse direction than the width of the wafer W movement region as shown in FIGS. 1 and 2. As shown also in FIGS. 3 and 4, an LED light source set 400 serving as a light source unit is provided inside the case body 40. The LED light source set 400 is formed by arranging a plurality of light-emitting blocks 42, e.g., eighty-eight (88) light-emitting blocks 42, in the transverse direction. Each light-emitting block 42 is formed of a plurality of LEDs 41, e.g., four (4) LEDs 41, arranged in the longitudinal direction. Incidentally, in the figures, the LED arrangement is simplified and a smaller number of LEDs are drawn for convenience to avoid difficulty in drawing the figures and to put a high priority on easy understanding of the structure.

The LED light source set 400 is fixed to a common LED substrate 43 provided in the case body 40 and is arranged so as to emit ultraviolet rays downward. A slit 44 serving as an irradiation hole extending in the transverse direction and longer than the width of the movement region for a wafer W in the transverse direction is formed through the base of the case body 40. The ultraviolet rays from the LED light source set 400 are emitted downwards from the optical irradiation unit 4 via the slit 44. A control circuit unit 45 constituting an LED control unit is provided on the upper surface side of the LED substrate 43. The control circuit unit 45 is configured to control light intensity of each light-emitting block 42 as will be explained later.

Returning to FIG. 1, a controller 60, arranged outside the housing 30 serving as the exterior of the optical processing apparatus, is connected to the optical irradiation unit 4 via a signal cable 60a. The controller 60 has an operation screen. The operation screen is used when an illuminance distribution pattern of each light-emitting block 42 explained later is acquired at the start of using the apparatus and when the operator operates the apparatus at times of calibration.

Figure 3:
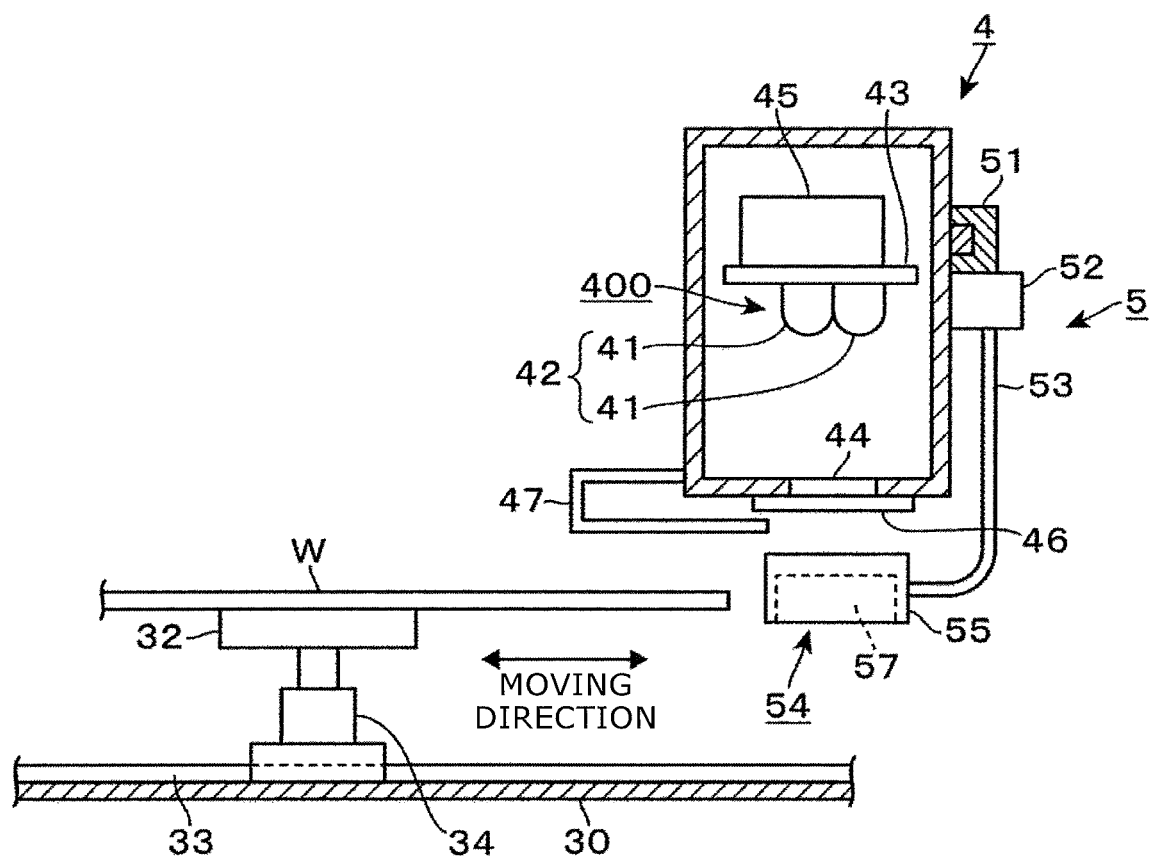
FIG. 3 is a vertical sectional side view showing the optical irradiation unit used for the optical processing apparatus.
Figure 4:
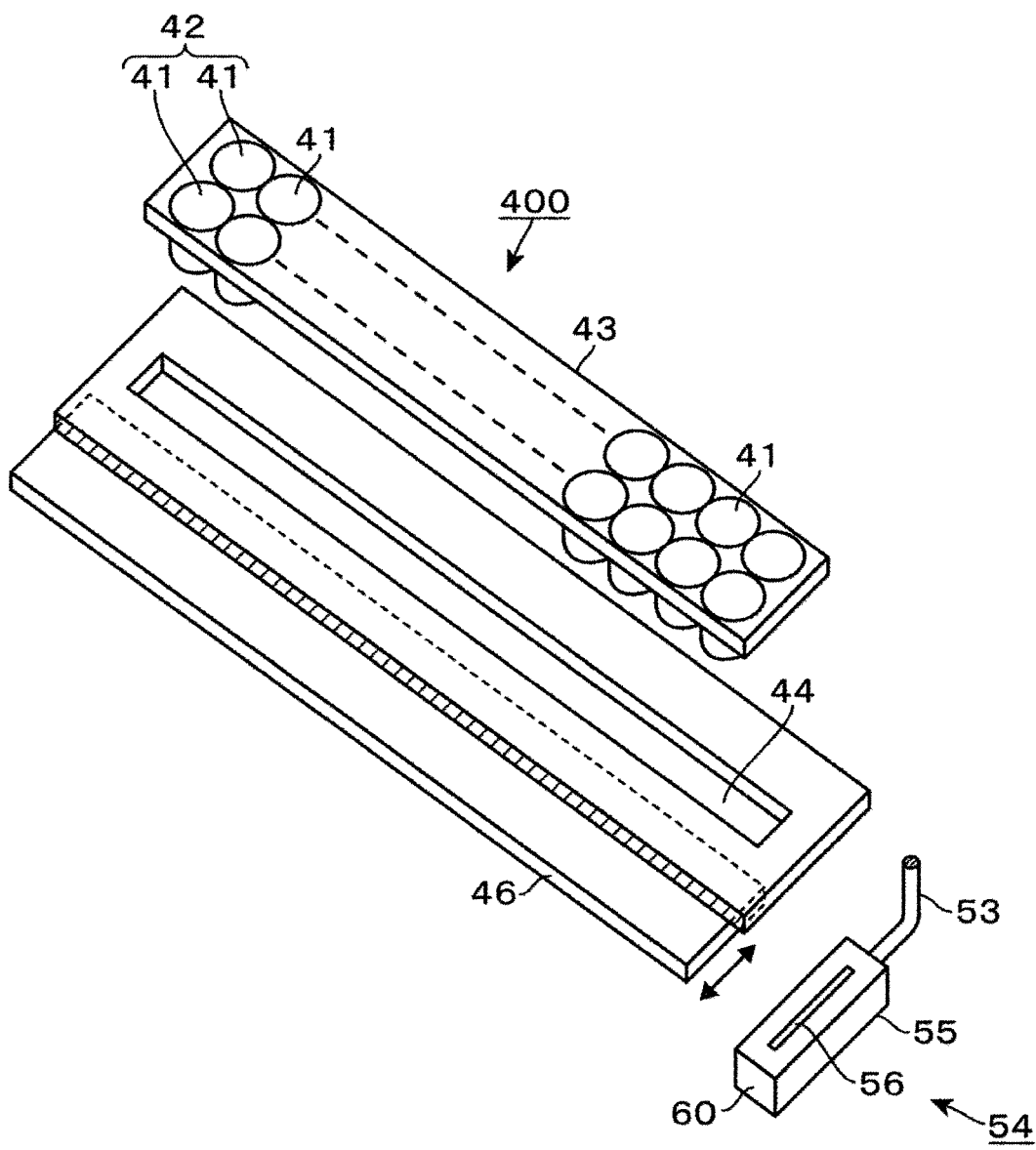
FIG. 4 is a schematic perspective view showing a part of the optical irradiation unit used for the optical processing apparatus.

As shown in FIGS. 2 to 4, a lower end part of the case body 40 is provided with a metallic shutter 46 extending in the transverse direction of the movement region for a wafer W and a shutter storage part 47 for storing the shutter 46 (see FIG. 3). The shutter 46 is moved, by a drive unit (not illustrated), between a position for closing the slit 44 and a position for being stored in the shutter storage part 47 and opening a part below the slit 44.

The optical processing apparatus further includes an illuminance measurement unit 5 for measuring the illuminance of the ultraviolet rays (light) emitted from the LED light source set 400 as shown in FIGS. 2 to 4. The illuminance measurement unit 5 includes an illuminance sensor 52 provided to be freely movable by a moving mechanism 51 in the transverse direction on the back side of the case body 40, an optical fiber 53 for transmitting light to the illuminance sensor 52, and a light condensation unit 54 provided at a tip end part of the optical fiber 53. The light condensation unit 54 is configured to be capable of moving under the optical irradiation unit 4 from one end to the other end in a lengthwise direction of an irradiation region accompanying the movement of the illuminance sensor 52 in order to condense the light emitted from the LED light source set 400. At times other than measurement in the irradiation region, the light condensation unit 54 stays on standby at a position deviated in the transverse direction from the movement region for a wafer W.

The light condensation unit 54 has a housing 55 in a square tube-like shape extending in the longitudinal direction. As shown in FIG. 4, the housing 55 has a slit 56 extending in a lengthwise direction of the light condensation unit 54, that is, in the longitudinal direction. The slit 56 is formed to be longer than the dimension of the strip-shaped irradiation region formed by the LED light source set 400 in regard to a width direction of the irradiation region.

Inside the housing 55 of the light condensation unit 54, a light condensation body 57 in a rectangular parallelepiped shape made of fluorescent glass is provided (see FIGS. 2 and 3). The light condensation body 57 emits light at illuminance corresponding to the illuminance of light entering through the slit 56. The light condensation body 57 emits light depending on the total illuminance of absorbed light, that is, the total illuminance of four LEDs 41 constituting each light-emitting block 42 (as mentioned earlier, in FIG. 5, "two" LEDs are shown for convenience). While the height of the top surface of the light condensation body 57 serving as a light-receiving surface coincides with the height of the front surface of the wafer W on the mount 32 in this example, it is not essential to make those heights coincide with each other.

The total illuminance of the four LEDs 41 constituting each light-emitting block 42 can be measured by leading the light condensed by the light condensation body 57 to the illuminance sensor 52 via the optical fiber 53 and measuring the light intensity with the illuminance sensor 52. In other words, the illuminance to be acquired by use of the illuminance sensor 52 corresponds to illuminance at each position in the transverse direction in regard to the strip-shaped irradiation region (irradiation region on the wafer W) extending in the transverse direction formed by the set of light-emitting blocks 42. An irradiation region formed by each light-emitting block 42 extends not only in the transverse direction but also in the longitudinal direction. The aforementioned illuminance at each position in the transverse direction can be evaluated by condensing the light in the irradiation region extending in the longitudinal direction by use of the light condensation unit 54 and measuring illuminance with the illuminance sensor 52.

Specifically, while the illuminance measured with the illuminance sensor 52 is surface illuminance (unit: W/cm$^2$), the surface illuminance is converted into line illuminance (unit: W/cm) by multiplying the measurement of the surface illuminance with a reference coefficient obtained from the result of preliminary measurement by use of an illuminance sensor. The unit of this coefficient is "cm" and the unit length is a length in the transverse direction (lengthwise direction of the aforementioned irradiation region). The reason for obtaining the line illuminance is that the line illuminance obtained as the accumulation of light amounts is important in the method in which the wafer W is moved with respect to the strip-shaped irradiation region corresponding to the diameter of the wafer W in the direction orthogonal to the irradiation region (i.e., the irradiation region is scanned relative to the wafer W). Incidentally, the position of the illuminance measurement unit 5 illustrated with dotted lines in FIG. 2 indicates the position where the illuminance measurement unit 5 stays on standby when optical processing such as a batch exposure process is performed on the wafer W.

Figure 5:
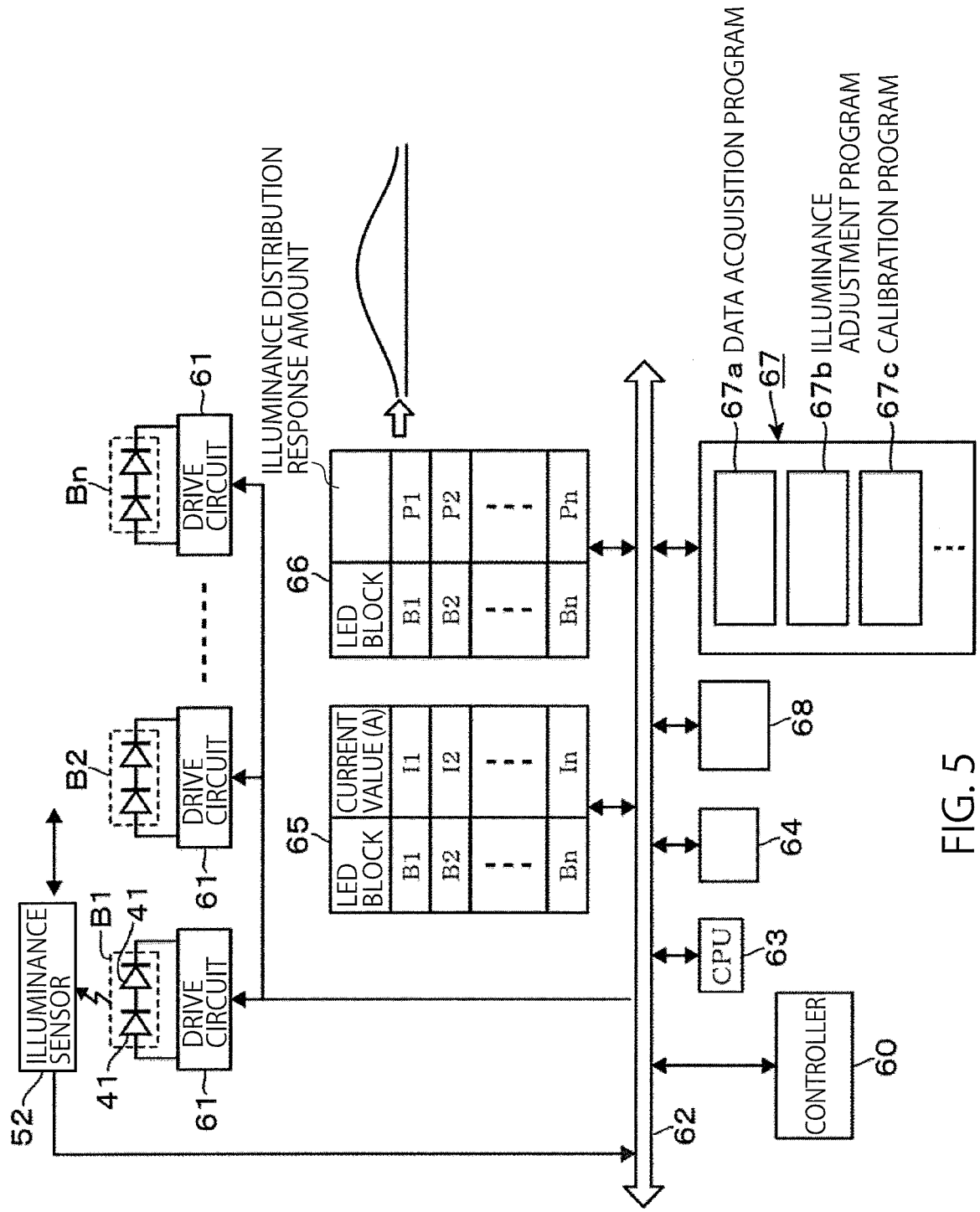
FIG. 5 is a configuration diagram of a part for performing current control on light-emitting blocks in the optical processing apparatus according to an embodiment of the present invention.

Next, a control system of the optical processing apparatus will be explained with reference to FIG. 5. In the following explanation, reference characters B1, B2, . . . , and Bn (n: integer corresponding to the number of the light-emitting blocks arranged) are assigned respectively to the light-emitting blocks from one end to the other end of the arrangement of the light-emitting blocks, for convenience of the explanation. However, there are also cases where the reference character "42" is used for each light-emitting block. In FIG. 5, the reference character 61 represents a drive circuit for driving LEDs 41. A plurality of LEDs 41, four LEDs for example (in FIG. 5, two LEDs 41), are connected in series to each drive circuit 61. Namely, the drive circuit 61 is provided for each light-emitting block 42. The drive circuit 61 includes a phase control circuit, for example, controls the firing angle of a switching element by use of a control signal corresponding to a current command value, thereby controls the conduction angle of the alternating-current waveform, and thereby adjusts the magnitude of the direct current to be equal to the current command value. Each drive circuit 61 is included in the control circuit unit 45 shown in FIGS. 2 and 3.

The control circuit unit 45 includes a bus 62, a CPU 63, and a memory 64 used for work. The control circuit unit 45 further includes a first storage unit 65 storing command values of the currents for driving the light-emitting blocks 42 (B1 to Bn), a second storage unit 66 storing an illuminance change amount per unit current which will be explained later, a program storage unit 67 storing programs which will be explained later, and a third storage unit 68 storing a target illuminance distribution pattern. While separate storage units are used for different types of stored data in this example for the sake of convenience, the storage units 65, 66 and 68 in reality are formed as storage areas in the same memory device corresponding to addresses different from each other, for example. The controller 60 shown in FIG. 1, having the operation screen, is connected to the bus 62.

Figure 6:
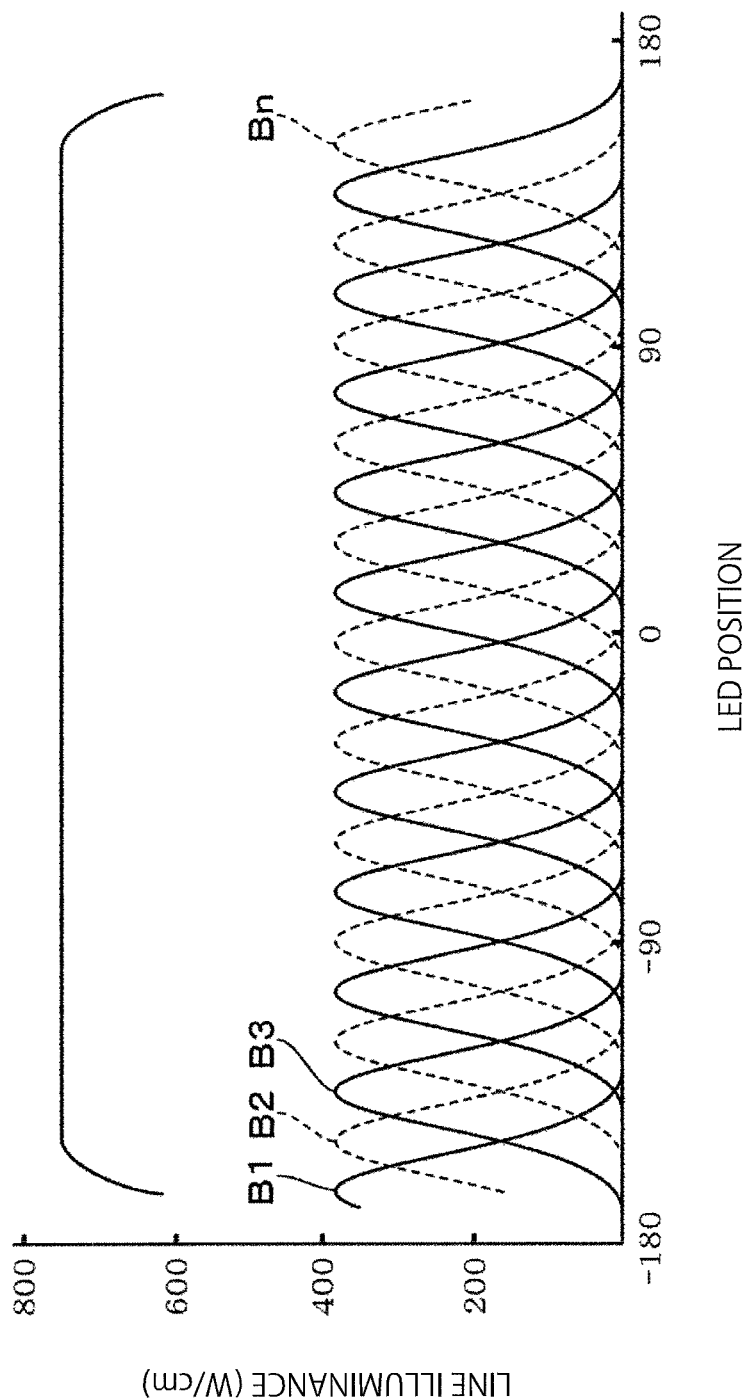
FIG. 6 is an explanatory drawing showing illuminance distribution patterns of respective light-emitting blocks in the optical irradiation unit and an illuminance distribution pattern of the entire set of light-emitting blocks in association with one another.

FIG. 6 is a graph in which the horizontal axis represents the position in the transverse direction in a passage region on the surface of the wafer W and the vertical axis represents the aforementioned line illuminance, where "0" represents a position through which the center of the wafer W passes. Each waveform line in the lower part of the graph represents a line illuminance distribution pattern corresponding to each light-emitting block 42 (B1 to Bn), while the line in the upper part of the graph in a shape like a horizontally long flat trapezoid (linear within the diameter of the wafer) represents the illuminance distribution pattern as the sum total of the line illuminances of the light-emitting blocks 42 (B1 to Bn). As is clear from FIG. 6, the illuminance distribution pattern on the wafer W surface corresponding to each light-emitting block 42 (B1 to Bn) can be adjusted by adjusting the light intensity of each light-emitting block 42 (B1 to Bn), that is, by adjusting the value of the current (drive current) of each light-emitting block 42 (B1 to Bn). Thus, the illuminance distribution pattern as the sum total of the line illuminances of the light-emitting blocks 42 (B1 to Bn) can be adjusted by adjusting the current value of each light-emitting block 42 (B1 to Bn).

To give a description about the LEDs, the LED characteristics slightly vary among individual LEDs due to manufacturing errors or the like, and thus the illuminance distribution pattern of each LED is not necessarily equal to each other even if the same current is fed to each LED. Further, even if the value of the current fed to an LED remains constant, the light-emitting intensity gradually drops due to variation of the LED with time. Therefore, it is desirable to design the overall structure, including the selection of the LEDs, so that a necessary illuminance distribution is obtained when a current lower than the LED's maximum allowable current value, such as a current at 70% of the maximum allowable current value, is fed to each LED at the start of use. With such design, even if the light-emitting intensity of each LED gradually drops, a necessary light-emitting intensity can be secured by increasing the current value, and the service life of the LEDs can be extended.

The second storage unit 66 stores an illuminance change amount at each position in a case where the current value of the current (drive current) fed to each light-emitting block 42 is gradually increased within a range of 70% to 100% of the maximum allowable current value, for example. The illuminance change amount means the amount of change in the illuminance at each position with respect to a change in the current when the current is changed (which can be referred to also as a change amount of the illuminance per unit current value). The "position" means the position on the wafer W in the transverse direction. Thus, the data associating each position and the illuminance change amount can be represented as an illuminance profile (illuminance distribution pattern) as schematically shown beside the second storage unit 66 in FIG. 5. The second storage unit 66 stores an illuminance distribution response amount of each light-emitting block B1 to Bn as P1 to Pn.

The illuminance distribution pattern as the illuminance profile indicates how much the illuminance at each position changes per unit current, e.g., per 0.1 mA when the unit current is determined as 0.1 mA, which can be regarded as the "response" of the illuminance distribution pattern to the change in the current, or the "gradient" of the illuminance distribution pattern with respect to the current value. In the following description, the term "illuminance distribution response amount" will be used to mean the "response (gradient)." Since the illuminance change amount corresponds to the amount of change in the aforementioned line illuminance, the unit of the illuminance change amount is in the dimension (W/cm·A) obtained by dividing energy (W) by unit length (cm) and unit current value (A). However, in regard to the data of the illuminance distribution response amount written to the second storage unit 66, the unit of the illuminance change amount may also be defined as "W/cm" by regarding the illuminance change amount as the value of the illuminance change amount (illuminance change) itself when the current is changed by 0.1 mA, for example. Namely, the vertical axis of the graph shown beside the second storage unit 66 in FIG. 5 may also be in the dimension (W/cm) obtained by multiplying the illuminance change amount (W/cm·A) by the current value (A).

Once the illuminance distribution response amount of each light-emitting block 42 (B1 to Bn) is acquired, it becomes clear how much change in the presently obtained illuminance distribution pattern of each light-emitting block 42 (B1 to Bn) (i.e., the illuminance distribution pattern in regard to each light-emitting block B1 to Bn) is caused by how much change in the presently used drive current. Since the illuminance distribution pattern formed in the whole wafer W passage region by the LED light source set 400 is represented by the sum total of the individual illuminance distribution patterns of the light-emitting blocks B1 to Bn, how much the total illuminance distribution pattern changes in the end can be grasped.

In this embodiment, the mechanism described above is used for the light amount adjustment at the start of use of the optical processing apparatus and the regular or irregular calibration.

A method for acquiring the illuminance distribution response amount will be described here. For example, at the start of use of the optical processing apparatus, only one of the light-emitting blocks B1 to Bn is lit up, the drive current is set at 70% of the maximum allowable current value, for example, the drive current is increased in units of 0.1 mA, for example, and the illuminance distribution pattern is obtained by measuring the illuminance at each position with the illuminance sensor 52 at each current value. This operation is performed successively for all the light-emitting blocks B1 to Bn. In the case where the drive current is increased in units of 0.1 mA, for example, the illuminance change amount is supposed to remain constant at every value of the drive current. However, in order to obtain the illuminance change amount with higher accuracy in consideration of measurement errors or the like, the illuminance change amounts each obtained at each change in the current value are averaged and the average is stored in the second storage unit 66 as the illuminance change amount of the light-emitting block 42.

Further, since it takes a while from the turning on of the LED 41 to the stabilization of the light emission, it is also possible, for example, to first set all the light-emitting blocks B1 to Bn at 90% of the maximum allowable current value, successively decrease the drive current in this state to 70% of the maximum allowable current value in units of 0.1 mA in regard to each light-emitting block B1 to Bn one by one, and obtain the illuminance distribution pattern by measuring the illuminance at each position with the illuminance sensor 52 at each current value. Although decreasing the drive current as above decreases the illuminance in the region corresponding to the light-emitting block 42 as the measurement object, the decrease (decrement) corresponds to the increase (increment) in the case of increasing the drive current, and thus the illuminance distribution response amount of each light-emitting block B1 to Bn can be acquired in a similar manner. With this method, the work time can be shortened since it is unnecessary to turn off the LEDs 41.

Returning to FIG. 5, the program storage unit 67 stores a data acquisition program 67a for acquiring the aforementioned illuminance distribution response amount, an illuminance adjustment program 67b for adjusting the light amount (light intensity) of each light-emitting block B1 to Bn at the start of use of the apparatus, a calibration program 67c for performing calibration regularly or irregularly, and so forth. The data acquisition program 67a is a program for acquiring the illuminance distribution response amount by performing steps like the increasing/decreasing of the drive current, movement control of the illuminance sensor 52, writing of the data of the illuminance change amount at each position, and so forth when the illuminance change amount of each light-emitting block B1 to Bn is obtained.

The illuminance adjustment program 67b and the calibration program 67c include steps for bringing the present illuminance distribution pattern in the lengthwise direction in the irradiation region close to a target illuminance distribution pattern as will be explained later. The steps are for determining a new current command value based on the change amount of the illuminance distribution pattern and the present current command value of each of the light-emitting blocks B1 to Bn. These steps correspond to an arithmetic processing unit as a component in the present invention. Incidentally, the program storage unit 67 also stores a program for controlling a series of operations of the mount 32, etc. from the loading of the wafer W into the housing 30 to the unloading of the wafer W from the housing 30.

The above-described programs are stored in a non-transitory computer-readable storage medium such as a flexible disk, a compact disc, a hard disk, a magneto-optical (MO) disk or a memory card, and are installed in the program storage unit 67 from the storage medium via the controller 60.

Next, the operation of the above-described embodiment will be explained below. When a new optical processing apparatus has been assembled and the operation of the apparatus is about to be started, light amount adjustment work is performed first in order to make the illuminance distribution pattern in the lengthwise direction in the (whole) irradiation region formed on the wafer W coincide with the target illuminance distribution pattern. To "coincide" does not necessarily mean to totally coincide but can also mean that the illuminance distribution patterns are close to each other to such an extent that the optical processing can be performed excellently.

Figure 7:
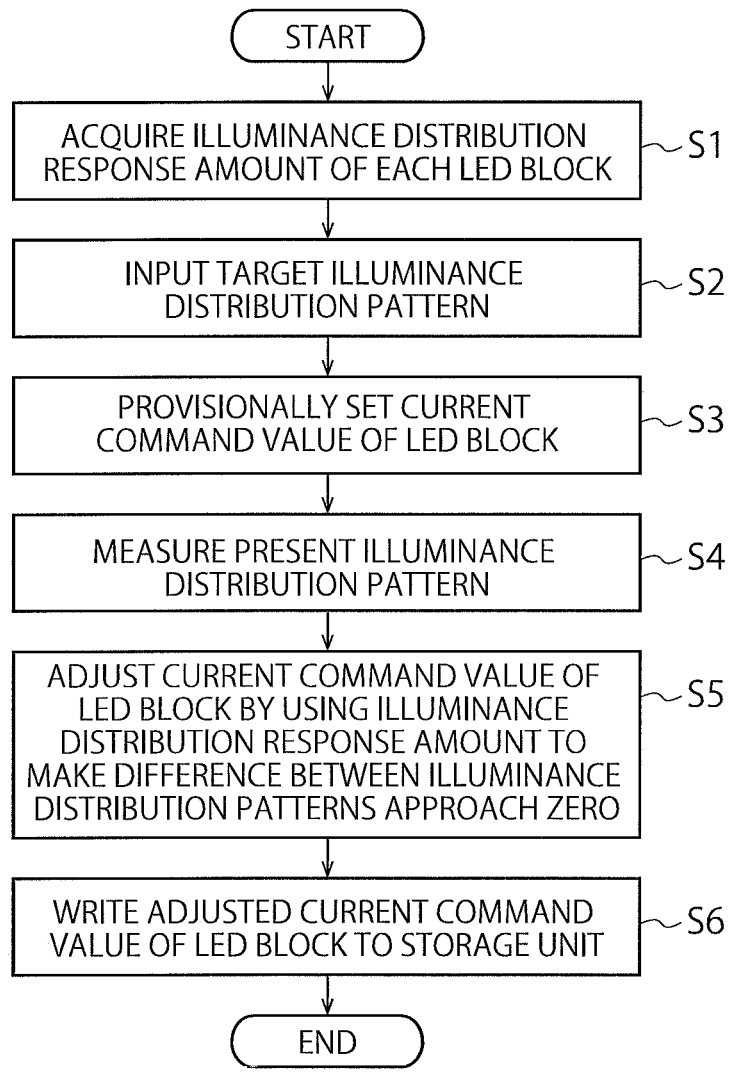
FIG. 7 is a flow chart showing a process for adjusting the illuminance distribution pattern by using the optical processing apparatus according to an embodiment of the present invention.

In the light amount adjustment work, each light-emitting block B1 to Bn is turned on (i.e., driven into the light-emitting state) and after the time for the stabilization of light emission has elapsed, the illuminance distribution response amount of each light-emitting block B1 to Bn is acquired according to the data acquisition program 67a (step S1). The operation for the acquisition of the illuminance distribution response amount has already been explained in detail, and thus repeated explanation thereof is omitted here. Subsequently, as shown in FIG. 7, data of the target illuminance distribution pattern in regard to the illuminance distribution pattern in the lengthwise direction in the (whole) irradiation region is inputted to the third storage unit 68 of the control circuit unit 45 from the controller 60 shown in FIGS. 1 and 5 (step S2).

Thereafter, the drive current of each light-emitting block B1 to Bn is provisionally set at a current value lower than the maximum allowable current value, such as 70% of the maximum allowable current value (step S3). Specifically, the current value is written to the first storage unit 65 as the current command value of each light-emitting block B1 to Bn. Then, the illuminance at each position is measured by moving the illuminance measurement unit 5 from one end to the other end of the irradiation region, and the total illuminance distribution pattern in the lengthwise direction of the irradiation region is obtained by converting the measured illuminances into the line illuminance as explained above (step S4).

Then, difference is obtained between the target illuminance distribution pattern inputted in the step S2 and the illuminance distribution pattern obtained in the step S4, and the current command value of each light-emitting block B1 to Bn is adjusted so as to make the difference approach zero, that is, so as to make the illuminance difference at each position approach zero (step S5).

When the present current command value of each light-emitting block B1 to Bn is increased/decreased, the illuminance distribution pattern of each light-emitting block B1 to Bn is determined according to the increase/decrease (increment/decrement) and the illuminance distribution response amount of each light-emitting block B1 to Bn, and the illuminance distribution pattern in the whole irradiation region can be obtained by calculating the sum of these illuminance distribution patterns. Thus, the work of adjusting the current command value is a process of searching for an increment/decrement that makes the aforementioned difference zero by varying the current value increment/decrement of each light-emitting block B1 to Bn in various ways. The process is performed by the illuminance adjustment program 67b corresponding to the arithmetic processing unit.

Figure 8:
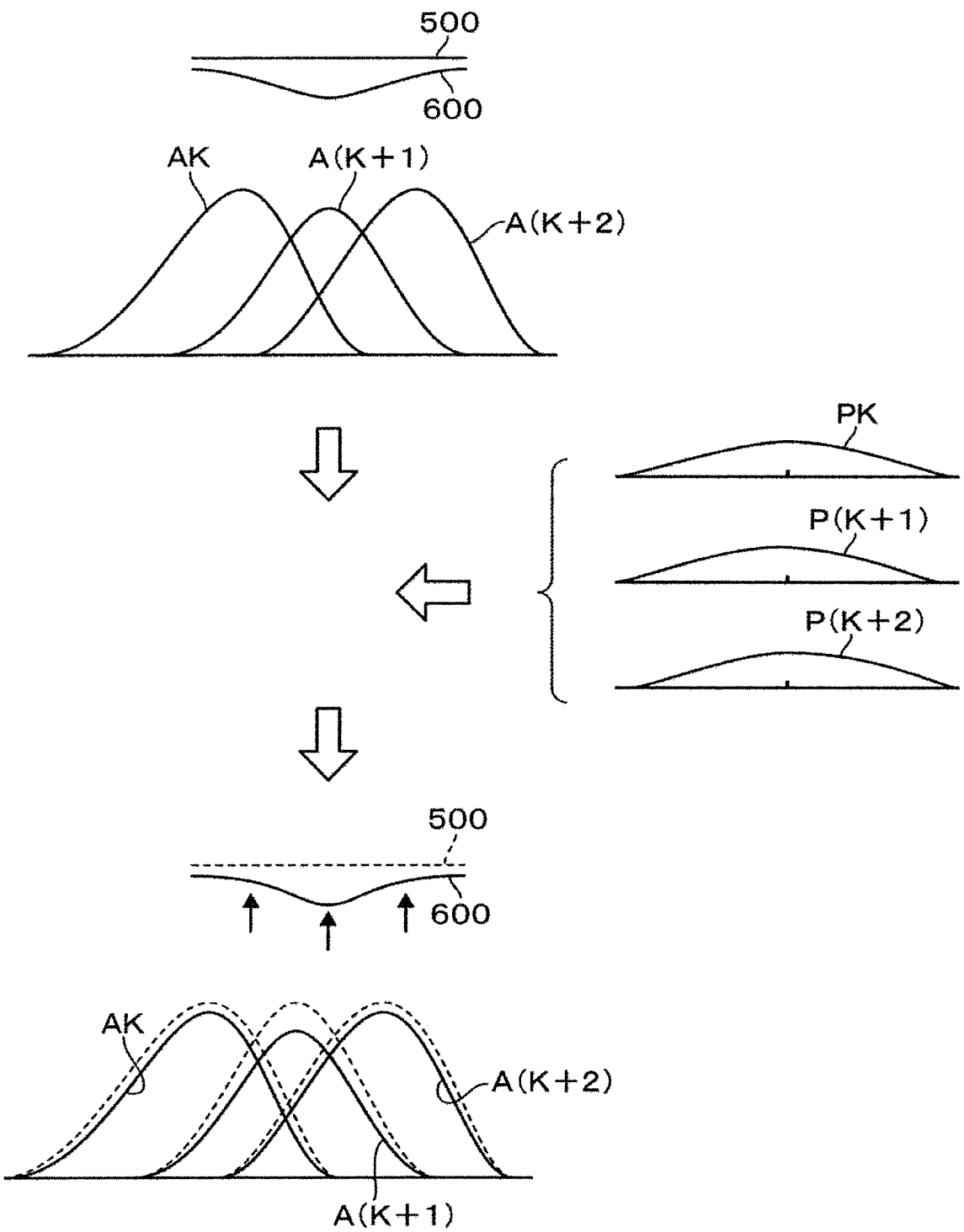
FIG. 8 is an explanatory drawing schematically showing how the illuminance distribution pattern is adjusted by using the optical processing apparatus according to an embodiment of the present invention.

Here, schematic diagrams for intuitively grasping how the illuminance distribution pattern is adjusted by using the current command values are shown in FIG. 8. The reference characters Ak, A(k+1) and A(k+2) respectively represent illuminance distribution patterns in the irradiation region formed on the wafer W by three light-emitting blocks Bk, B(k+1) and B(k+2) aligned consecutively. Illuminance distribution patterns formed by light-emitting blocks on both sides of the line of light-emitting blocks Bk, B(k+1) and B(k+2) are omitted in FIG. 8. The reference character 500 represents the target illuminance distribution pattern, while the reference character 600 represents the illuminance distribution pattern formed by the respective light-emitting blocks. Since the illuminance distribution pattern A(k+1) is especially low, a part of the total illuminance distribution pattern corresponding to the light-emitting block B(k+1) has become especially low.

Therefore, each illuminance distribution pattern Ak, A(k+1), A(k+2) is raised/lowered by increasing/decreasing the present current command value of each light-emitting block Bk, B(k+1), B(k+2) by using the illuminance distribution response amounts Pk, P(k+1), P(k+2) of the respective light-emitting block Bk, B(k+1), B(k+2). In this example, the respective illuminance distribution patterns Ak, A(k+1), A(k+2) are raised, as indicated by dotted lines, by increasing the current command values of the respective light-emitting block Bk, B(k+1), B(k+2). Accordingly, the total illuminance distribution pattern 600 is pushed up to an illuminance distribution pattern approximate to the target illuminance distribution pattern 500.

This current command value adjustment work is performed by using the least-squares method, for example, by squaring the difference between the illuminance at each position in the target illuminance distribution pattern and the illuminance at each position in the present illuminance distribution pattern and determining a combination of current command values of the light-emitting blocks B1 to Bn minimizing the sum total of the squared values at the positions.

After the current command values of the light-emitting blocks B1 to Bn are determined, each current command value is stored in the first storage unit 65 (step S6). In the first storage unit 65 shown in FIG. 5, the current command values are described as I1 to In. When the optical processing apparatus is operated, the current command values read out from the first storage unit 65 are sent to the drive circuits 61 and the light-emitting blocks B1 to Bn are driven by currents corresponding to the current command values.

To describe the operation of the optical processing apparatus, the wafer W constituting a substrate as the workpiece is handed over by an external transfer arm to the mount 32 situated at the handover position in the housing 30 via the carry-in/carry-out port 31 shown in FIG. 1. Then, the mount 32 is moved to the standby position in a state with the shutter 46 of the optical irradiation unit 4 closed, for example, and the positioning of the wafer W is carried out. As a result of the positioning, an alignment direction of a circuit chip region on the wafer W coincides with the lengthwise direction of the irradiation region, for example.

Subsequently, the shutter 46 of the optical irradiation unit 4 is opened and the mount 32 is moved from the standby position towards the handover position (forward). Accordingly, the wafer W gradually passes through the strip-shaped irradiation region under the optical irradiation unit 4. In other words, the strip-shaped irradiation region relatively scans the surface of the wafer W. In the wafer W movement region in the strip-shaped irradiation region, the illuminance distribution pattern has been adjusted to the target illuminance distribution pattern such as an illuminance distribution pattern uniform in the lengthwise direction with high accuracy, and thus the amount of exposure becomes uniform throughout the wafer W. The wafer W that returned to the handover position is taken out by the external transfer arm.

After the operation of the optical processing apparatus is started, the calibration of the LED light source set 400 is performed regularly, for example. This is because the amount of light emission of each LED gradually drops along with use as mentioned earlier and the drive current has to be increased. While the calibration is performed similarly to the light amount adjustment work performed at the start of the operation of the apparatus, the target illuminance distribution pattern and the illuminance distribution response amount of each light-emitting block 42 have already been inputted and the current command values have already been set, and thus only the steps S4 to S6 in the flow shown in FIG. 7 are carried out. Specifically, the illuminance distribution pattern is obtained by measuring the present illuminance with the illuminance sensor 52 in the lengthwise direction of the irradiation region, current values that make the illuminance distribution pattern as close to the target illuminance distribution pattern as possible are obtained, and the obtained current values are specified as the new current command values.

In the embodiment described above, the illuminance distribution response amount as the change amount of the illuminance distribution pattern (illuminance profile), associating the position in the irradiation region in the lengthwise direction with the change amount of the illuminance with respect to the change in the current (drive current), has previously been acquired for each light-emitting block 42. Then, by using the illuminance distribution response amount, the illuminance distribution pattern of each light-emitting block 42 is obtained, and the illuminance distribution pattern of all the light-emitting blocks in the lengthwise direction is estimated by obtaining the sum of the illuminance distribution patterns of the light-emitting blocks 42. Since it is possible to obtain the present illuminance distribution pattern in the whole range in the lengthwise direction by using the illuminance sensor 52 and to bring the illuminance distribution pattern close to the target illuminance distribution pattern by using the illuminance distribution response amounts, the illuminance distribution pattern in the lengthwise direction of the irradiation region can be adjusted to the target illuminance distribution pattern with ease and with high accuracy, and difference in the illuminance distribution pattern among a plurality of optical processing apparatuses can be kept down.

The optical processing apparatus described above may also be configured to include an LED monitoring unit for monitoring the operating status of each light-emitting block 42 and to detect an abnormal light-emitting block including a light-emitting diode that abnormally dropped in the amount of light emission or stopped light emission. The LED monitoring unit may be, for example, a circuit that monitors the current of each light-emitting block 42 and outputs an abnormality detection signal when the current drops to or below a threshold value, or may employ the illuminance sensor 52. In cases where the illuminance sensor 52 is employed, the illuminance sensor 52 is moved and the illuminance is measured upon each processing of a wafer W or at times like before starting the processing of each lot (a set of wafers in units of carriers C). An abnormal light-emitting block 42 can be detected by judging whether or not the illuminance at the position corresponding to each light-emitting block 42, e.g., at the position corresponding to the center of the LEDs of each light-emitting block 42, has dropped to or below a threshold value based on the result of the measurement.

Upon detection of an abnormality by the LED monitoring unit, the abnormality detection signal is outputted, the calibration program 67c corresponding to an execution processing unit is activated according to the output, for example, and the flow from the step S4 in FIG. 7 is carried out. In cases where the illuminance sensor 52 is employed as the LED monitoring unit, the present illuminance distribution pattern may be obtained in the illuminance measurement for detecting an abnormal light-emitting block.

By employing such a configuration, the optical processing can be continued even when an abnormality has occurred to a light-emitting block 42. Accordingly, there are advantages in that the occurrence of a downtime of the apparatus can be avoided and the service life of the apparatus can be extended.

While the target illuminance distribution pattern in the above-described embodiment is assumed to be uniform in the movement region of the wafer W, for example, the target illuminance distribution pattern may be set flexibly depending on the role the apparatus is required to play. For example, when the line width of the pattern on one surface of the wafer W tends to be narrow at the stage of preprocessing, it is possible to make a setting like lowering the illuminance of the irradiation region corresponding to the one surface in comparison with the other surface.

It is also possible to uniformalize the illuminance distribution in the lengthwise direction of the irradiation region (transverse direction) and a short direction of the irradiation region (longitudinal direction) by superimposing light fluxes from the LED light source set 400 on each other by use of a homogenizer employing a lens array, a fly-eye lens or a prism. With such a configuration, the illuminance distribution in the short direction (longitudinal direction) can be uniformalized further.

While the illuminance measurement unit 5 is configured to be freely movable in the transverse direction to have the illuminance sensor 52 scan the illuminance at each position in the above-described example, the illuminance measurement unit 5 may also be configured in the fixed type to measure the illuminance in the irradiation region all at once.

Further, the workpiece processed by the optical processing apparatus is not limited to a wafer W coated with a resist of the photosensitization chemical amplification type; the optical processing apparatus can be an apparatus that performs sensitization and/or line width adjustment on a wafer W coated with an ordinary type of resist. The optical processing apparatus may also be, for example, an apparatus that irradiates a carbon film, as a coating film to serve as a protective film at the time of dry etching, with light to promote a crosslinking reaction in the carbon film and thereby increase the carbon film's resistance to the etching, or an apparatus that promotes the curing of a resist film. The optical processing apparatus may also be an apparatus for curing an organic film, or an apparatus for adjusting the film thickness of a lower layer film in a coating film by irradiating the wafer W with light.

Figure 9:
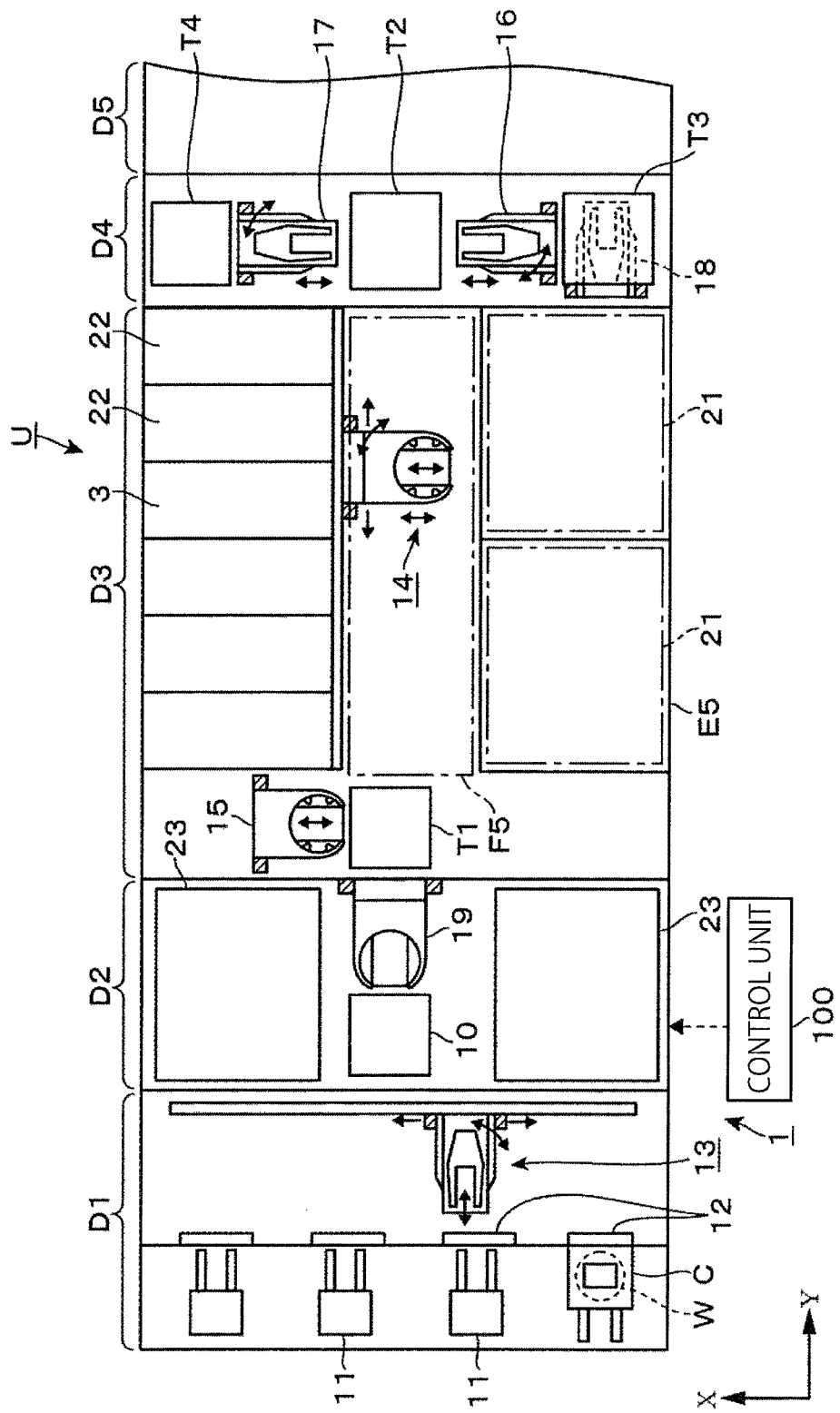
FIG. 9 is a plan view of a coating/development apparatus in which the optical processing apparatus according to an embodiment of the present invention has been installed.

Next, an example in which the optical processing apparatus is applied to a coating/development apparatus that forms a resist pattern by coating a wafer W with a photosensitization chemical amplification type resist and developing the wafer W after exposure will be described below as a coating/development apparatus according to the embodiment of the present invention. As shown in FIG. 9, the coating/development apparatus 1 is formed by connecting a carrier block D1, an inspection block D2, a processing block D3 and an interface block D4 linearly in a lateral direction. An exposure device D5 is connected to the interface block D4. The carrier block D1 includes mount stages 11 on each of which a carrier C storing a wafer W being a circular substrate can be placed. In FIG. 9, the reference character 12 represents an open/close part and the reference character 13 represents a transfer mechanism for transferring the wafer W between the carrier C and the inspection block D2.

The inspection block D2 is provided with two inspection devices 23 arranged side by side as viewed from the carrier block D1 side. A handover stage 10 on which the wafer W is temporarily set is provided on the carrier block D1 side of a space between the inspection devices 23, while a transfer mechanism 19 for handing over the wafer W among the handover stage 10, the inspection devices 23 and the processing block D3 is provided on the processing block D3 side of the space between the inspection devices 23. The inspection devices 23 perform inspection of the line width of the pattern formed on the wafer W after the development process. Specifically, the wafer W is divided in its radial direction into subregions, the line width of the pattern in each subregion is detected, and the position of each subregion on the wafer W and the line width of the pattern are associated with each other and stored in a control unit 100 as pattern information.

Figure 10:
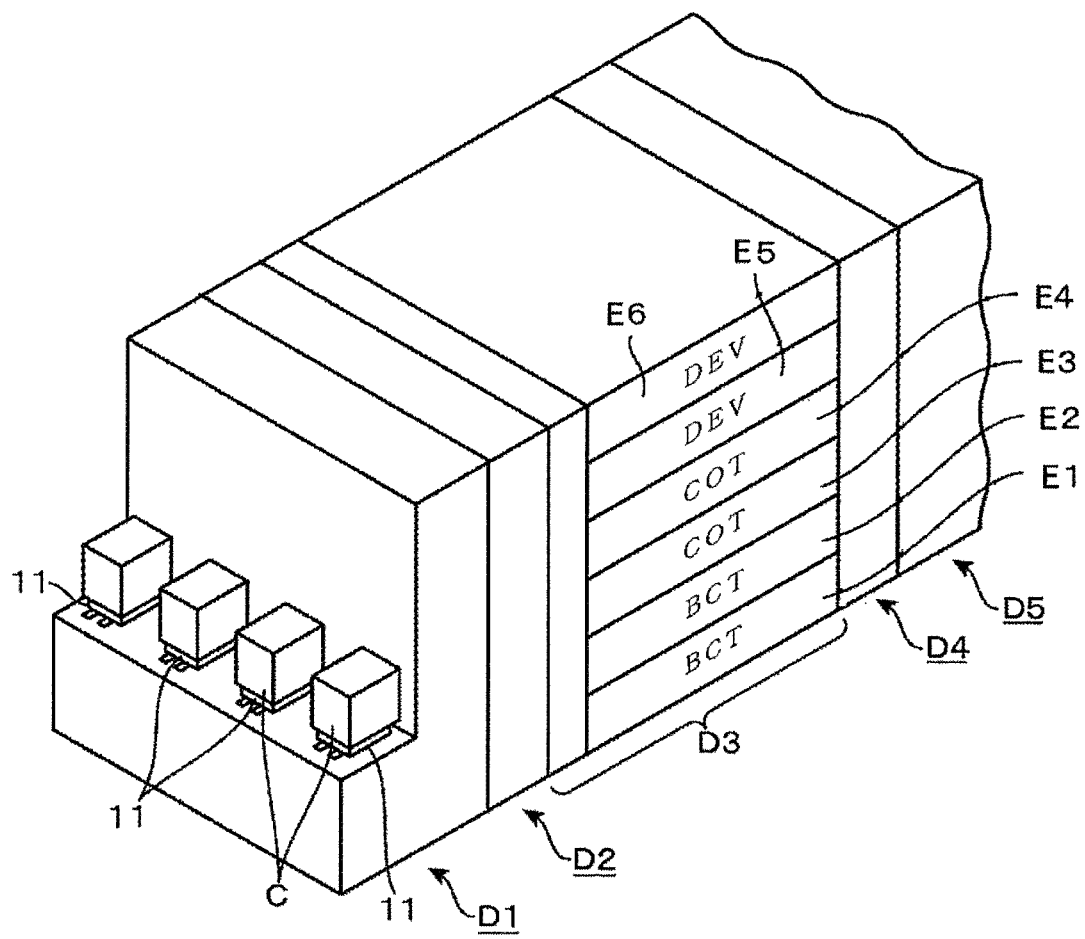
FIG. 10 is a perspective view showing the external appearance of the coating/development apparatus.

As shown in FIG. 10, the processing block D3 is formed by stacking up unit blocks E1 to E6, each for performing liquid treatment on the wafer W, in this order from the bottom. In these unit blocks E1 to E6, the transfer and processing of wafers W are carried out in parallel with each other. The unit blocks E1 and E2 are configured in the same way as each other, the unit blocks E3 and E4 are configured in the same way as each other, and the unit blocks E5 and E6 are configured in the same way as each other.

Here, the unit block E5 among the unit blocks will be explained as a representative example with reference to FIG. 9. On one side of a transfer region F5 extending from the inspection block D2 to the interface block D4, a plurality of rack units U are arranged in the longitudinal direction. On the other side of the transfer region F5, two development modules 21 are arranged in the longitudinal direction. The development module 21 supplies a developing solution to a resist film formed on the surface of the wafer W. Each rack unit U includes a heating module 22 for heating the wafer W and a batch exposure device 3 as the optical processing apparatus. The aforementioned transfer region F5 is provided with a transfer arm 14 as a wafer W transfer mechanism. The wafer W is transferred among modules arranged in the unit block E5 and modules in towers T1 and T2 explained later arranged at the same height as the unit block E5.

The unit blocks E1 to E4 are configured in the same way as the unit blocks E5 and E6 except for the fact that the chemical solutions supplied to the wafer W are different. Each of the unit blocks E1 and E2 includes antireflective film formation modules for supplying a chemical solution for forming an antireflective film to the wafer W instead of the development modules 21. Each of the unit blocks E3 and E4 includes resist film formation modules for supplying a resist of the chemical amplification type to the wafer W as the chemical solution and thereby forming a resist film instead of the development modules 21.

A tower T1 extending vertically across the unit blocks E1 to E6 and a handover arm 15 as an elevatable handover mechanism for handing over the wafer W to the tower T1 are arranged on the inspection block D2 side of the processing block D3. The tower T1 is formed of a plurality of modules stacked up, and includes handover modules on each of which a wafer W can be set.

The interface block D4 includes towers T2, T3 and T4 extending vertically across the unit blocks E1 to E6. The interface block D4 is provided with an interface arm 16 as an elevatable handover mechanism for handing over a wafer W to the towers T2 and T3, an interface arm 17 as an elevatable handover mechanism for handing over a wafer W to the towers T2 and T4, and an interface arm 18 for handing over a wafer W between the tower T2 and the exposure device D5. The exposure device D5 exposes the surface of the wafer W by using a pattern mask. The tower T2 is formed by stacking up handover modules, a buffer module for storing and retaining a plurality of wafers W before the exposure process, a buffer module for storing a plurality of wafers W after the exposure process, a temperature control module for performing temperature control of the wafers W, and so forth. In FIG. 9, the reference character 100 represents the control unit. The control unit 100 performs transfer control of the wafers W in the coating/development apparatus 1 and management of process recipes.

The processing of the wafer W in the system formed of the coating/development apparatus 1 and the exposure device D5 described above will be explained below. First, the overall flow of the wafer W in the coating/development apparatus 1 and the exposure device D5 will be explained. The wafer W is transferred by the transfer mechanism 13 from a carrier C and is placed on the handover stage 10 in the inspection block D2. Subsequently, the wafer W is transferred by the transfer mechanism 19 to a handover module of the tower T1 in the processing block D3. From this handover module, the wafer W is distributed by the handover arm 15 to one of the handover modules of the tower T1 each corresponding to the unit blocks E1 and E2 and thereafter transferred.

The wafer W after being distributed as above is transferred in the order of the handover module, the antireflective film formation module, the heating module, and the handover module, and subsequently distributed by the handover arm 15 to one of the handover modules each corresponding to the unit blocks E3 and E4. The wafer W distributed to the handover module in this way is transferred to a corresponding resist film formation module, in which a resist film is formed by coating the whole surface of the wafer W with a resist of the photosensitization chemical amplification type. Thereafter, the wafer W is transferred in the order of the heating module and the handover module of the tower T2, and thereafter loaded into the exposure device D5 via the tower T3. In the exposure device D5, the exposure process is performed by use of a pattern mask. Accordingly, acid and photosensitizer are generated in regions on the wafer W pattern-exposed by the exposure process.

The wafer W after undergoing the pattern exposure is transferred to the unit block E5 or E6. Thereafter, in the batch exposure device 3 as the optical processing apparatus, the whole surface of the wafer W undergoes exposure, the aforementioned photosensitizer absorbs light, and acid and photosensitizer are generated further in the pattern-exposed regions. Due to the batch exposure performed as above, acid multiplies in the pattern-exposed regions in the resist film. Thereafter, the wafer W is transferred to the heating module 22 and heated. In the heating module 22, the pattern-exposed regions are modified due to the acid and becomes soluble to the developing solution. Subsequently, the wafer W is transferred to the development module 21, in which the developing solution is supplied to the wafer W, the modified regions are dissolved in the developing solution, and the resist pattern in formed. Thereafter, the wafer W is transferred to the tower T1, then loaded into the carrier block D1 through the inspection block D2, and returned to the carrier C via the transfer mechanism 13.

In the above-described system formed of the coating/development apparatus 1 and the exposure device D5, film deposition is carried out by using an inspection wafer prior to the processing of the wafer W as the product, for example, and the illuminance of each cell of the LED light source set 400 in the batch exposure device 3 is determined based on pattern information on the inspection wafer obtained by the inspection device 23.

The invention claimed is:

1. An optical processing apparatus comprising:
   a mount part on which a workpiece to be processed with light is set;
   an optical irradiation unit in which a plurality of light-emitting blocks, each formed of one light-emitting diode or a plurality of light-emitting diodes connected in series, are linearly arranged in a transverse direction for forming a strip-shaped irradiation region extending in the transverse direction;
   a moving mechanism for moving the mount part and the optical irradiation unit relative to each other in a longitudinal direction;
   a storage unit that stores a change amount of an illuminance distribution pattern, associating each position in the irradiation region in the transverse direction with a change amount of illuminance at each position with respect to a change in current, in regard to each of the light-emitting blocks; and
   an arithmetic processing unit that determines a current command value of each of the light-emitting blocks based on a present current command value of each of the light-emitting blocks and the change amount of the illuminance distribution pattern of each of the light-emitting blocks stored in the storage unit to bring a present illuminance distribution pattern in the irradiation region in a lengthwise direction close to a target illuminance distribution pattern,
   wherein the present illuminance distribution pattern in a whole of the irradiation region in the lengthwise direction is estimated by obtaining a sum of the illuminance distribution patterns of the respective light-emitting blocks.

2. The optical processing apparatus according to claim 1, wherein the change amount of the illuminance with respect to the change in the current is a change amount of line illuminance in the transverse direction obtained based on surface illuminance at each position.

3. The optical processing apparatus according to claim 2, comprising an illuminance measurement unit for measuring the illuminance in the irradiation region.

4. The optical processing apparatus according to claim 3, wherein the illuminance measurement unit is configured to be movable in an alignment direction of the light-emitting blocks.

5. The optical processing apparatus according to claim 3, wherein the illuminance measurement unit includes:
   a strip-shaped light-receiving hole extending in the longitudinal direction;
   a prismatic part arranged in such a manner that strip-shaped light received through the light-receiving hole is incident upon one surface other than two end surfaces and the light exits from one of the two end surfaces; and
   an illuminance sensor that receives the light exiting from the end surface of the prismatic part.

6. The optical processing apparatus according to claim 2, comprising:
   an LED monitoring unit that monitors operating status of the light-emitting blocks; and
   an execution processing unit that executes a step of obtaining the illuminance distribution pattern in the lengthwise direction by detecting the illuminance in the whole of the irradiation region formed by the optical irradiation unit with an illuminance measurement unit when an abnormal light-emitting block including a light-emitting diode that abnormally dropped in the amount of light emission or stopped light emission is detected by the LED monitoring unit, and a step of determining the current command value of each of the light-emitting blocks with the arithmetic processing unit based on the present current command value of each of the light-emitting blocks and the change amount of the illuminance distribution pattern of each of the light-emitting blocks stored in the storage unit in order to bring the illuminance distribution pattern obtained by the former step close to the target illuminance distribution pattern.

7. The optical processing apparatus according to claim 2, wherein the optical processing apparatus is an apparatus that performs pattern exposure on a substrate on which a resist film has been formed, by use of a pattern mask and thereafter performs exposure on a pattern-exposed region.

8. The optical processing apparatus according to claim 1, comprising an illuminance measurement unit for measuring the illuminance in the whole of the irradiation region.

9. The optical processing apparatus according to claim 8, wherein the illuminance measurement unit is configured to be movable in an alignment direction of the light-emitting blocks.

10. The optical processing apparatus according to claim 8, wherein the illuminance measurement unit includes:
  a strip-shaped light-receiving hole extending in the longitudinal direction;
  a prismatic part arranged in such a manner that strip-shaped light received through the light-receiving hole is incident upon one surface other than two end surfaces and the light exits from one of the two end surfaces; and
  an illuminance sensor that receives the light exiting from the end surface of the prismatic part.

11. The optical processing apparatus according to claim 1, comprising:
  an LED monitoring unit that monitors operating status of the light-emitting blocks; and
  an execution processing unit that executes a step of obtaining the illuminance distribution pattern in the lengthwise direction by detecting the illuminance in the whole of the irradiation region formed by the optical irradiation unit with an illuminance measurement unit when an abnormal light-emitting block including a light-emitting diode that abnormally dropped in the amount of light emission or stopped light emission is detected by the LED monitoring unit, and a step of determining the current command value of each of the light-emitting blocks with the arithmetic processing unit based on the present current command value of each of the light-emitting blocks and the change amount of the illuminance distribution pattern of each of the light-emitting blocks stored in the storage unit in order to bring the illuminance distribution pattern obtained by the former step close to the target illuminance distribution pattern.

12. The optical processing apparatus according to claim 1, wherein the optical processing apparatus is an apparatus that performs pattern exposure on a substrate on which a resist film has been formed, by use of a pattern mask and thereafter performs exposure on a pattern-exposed region.

13. A coating/development apparatus comprising:
  a module for forming a resist film on a substrate by using a coating liquid;
  a module for developing the substrate after pattern exposure;
  a transfer mechanism for transferring the substrate between the modules; and
  the optical processing apparatus according to claim 1.

14. An optical processing method for processing a workpiece with light, wherein:
  the optical processing method uses:
    an optical irradiation unit in which a plurality of light-emitting blocks, each formed of one light-emitting diode or a plurality of light-emitting diodes connected in series, are linearly arranged in a transverse direction for forming a strip-shaped irradiation region extending in the transverse direction; and
    a storage unit that stores a change amount of an illuminance distribution pattern, associating each position in the irradiation region in the transverse direction with a change amount of illuminance at each position with respect to a change in current, in regard to each of the light-emitting blocks, and
  the optical processing method comprises the steps of:
    determining a current command value of each of the light-emitting blocks based on a present current command value of each of the light-emitting blocks and the change amount of the illuminance distribution pattern of each of the light-emitting blocks stored in the storage unit in order to bring a present illuminance distribution pattern in the irradiation region in a lengthwise direction close to a target illuminance distribution pattern;
    making each of the light-emitting blocks emit light at the current command value determined by the former step; and
    subsequently moving the optical irradiation unit and a mount part on which the workpiece is set relative to each other in a longitudinal direction,
    wherein the present illuminance distribution pattern in a whole of the irradiation region in the lengthwise direction is estimated by obtaining a sum of the illuminance distribution patterns of the respective light-emitting blocks.

15. The optical processing method according to claim 14, wherein a step of measuring the illuminance in the whole of the irradiation region is performed prior to the step of determining the current command value.

16. The optical processing method according to claim 15, comprising the steps of:
  monitoring operating status of the light-emitting blocks;
  obtaining the illuminance distribution pattern in the lengthwise direction by detecting the illuminance in the whole of the irradiation region formed by the optical irradiation unit when an abnormal light-emitting block including a light-emitting diode that abnormally dropped in the amount of light emission or stopped light emission is detected by the former step; and
  determining the current command value of each of the light-emitting blocks based on the present current command value of each of the light-emitting blocks and the change amount of the illuminance distribution pattern of each of the light-emitting blocks stored in the storage unit in order to bring the illuminance distribution pattern obtained by the former step close to the target illuminance distribution pattern.

17. The optical processing method according to claim 14, comprising the steps of:
  monitoring operating status of the light-emitting blocks;
  obtaining the illuminance distribution pattern in the lengthwise direction by detecting the illuminance in the whole of the irradiation region formed by the optical irradiation unit when an abnormal light-emitting block including a light-emitting diode that abnormally dropped in the amount of light emission or stopped light emission is detected by the former step; and determining the current command value of each of the light-emitting blocks based on the present current command value of each of the light-emitting blocks and the change amount of the illuminance distribution pattern of each of the light-emitting blocks stored in the storage unit in order to bring the illuminance distribution pattern obtained by the former step close to the target illuminance distribution pattern.

18. A non-transitory computer-readable storage medium storing a computer program to be used for an apparatus that performs processing on a workpiece by irradiating the workpiece with light and includes:

an optical irradiation unit in which a plurality of light-emitting blocks, each formed of one light-emitting diode or a plurality of light-emitting diodes connected in series, are linearly arranged in a transverse direction for forming a strip-shaped irradiation region; and a storage unit that stores a change amount of an illuminance distribution pattern, associating each position in the irradiation region in the transverse direction with a change amount of illuminance at the position per unit current, in regard to each of the light-emitting blocks, wherein the computer program describes steps programmed to execute the optical processing method according to claim 14.

* * * * *